United States Patent [19]

Buttemer

[11] 4,270,187

[45] May 26, 1981

[54] ACTIVATOR UNITS FOR IDENTIFICATION SYSTEMS AND SYSTEMS EMPLOYING SAME

[76] Inventor: David A. Buttemer, P.O. Box 1252, Pietermaritzburg 3200, South Africa

[21] Appl. No.: 20,734

[22] Filed: Mar. 15, 1979

Related U.S. Application Data

[63] Continuation of Ser. No. 842,878, Oct. 17, 1977.

[30] Foreign Application Priority Data

Oct. 21, 1976 [ZA] South Africa ........................ 76/6264

[51] Int. Cl.² .............................................. G11C 13/00

[52] U.S. Cl. ..................................... 365/189; 365/192; 365/198; 307/238.3

[58] Field of Search ............... 365/189, 192, 198, 159; 307/238

[56] References Cited

U.S. PATENT DOCUMENTS 3,162,842 12/1964 Miller et al. ......................... 365/159

*Primary Examiner*—Terrell W. Fears

[57] ABSTRACT

The invention provides an activator unit which is suitable for use in an identification system and which embodies a memory for the storage of a code therein and means for introducing a selected code into the memory by way of a programming units external to the activator unit.

22 Claims, 5 Drawing Figures

ACTIVATOR UNITS FOR IDENTIFICATION SYSTEMS AND SYSTEMS EMPLOYING SAME

This is a continuation of application Ser. No. 842,878 filed Oct. 17, 1977.

This invention relates to acitivator units which in use are attached to or themselves constitute a movable body, and which are adapted for co-operation with detector units to form a part of or a whole identification system.

More particularly, but not exclusively, the invention relates to activator units for association with movable bodies and which can be detected by a detector unit while the movable body is in motion. The broadest application at the present time for such systems is in the control or monitoring of vehicular traffic. Such control is generally exercised with regard to providing access to and from parking areas or other restricted areas but great potential exists in the more direct control of traffic i.e., by utilizing the identification systems to operate traffic lights for example. In the latter instance emergency vehicles can automatically be given priority over other traffic and also, if required, to give selected priorities to omnibuses optionally according to the number of passengers therein. A further extension of this application of the invention would be the computerised control of traffic flow and also, possibly, the computerized levying of raod taxes and tolls according to roads upon which vehicles are driven. From the above it will be understood that in some applications it may be satisfactory for a plurality of vehicles of a certain class to have activator units with identical codes but in others each vehicle must be individually identifiable.

In this application the activator units are designed to transmit their coded identification number to a detector unit associated with a roadway for example. Transmission generally takes place by way of electromagnetic radiation generated by the activator unit and detection thereof is effected by way of a loop detector whereof the loop is buried under or secured to the surface of the roadway. However, the 'positive' transmission of the coded identification number may not be necessary where the transmission is effected by a system wherein an activator simply inflicts a load pattern on radiation emitted by the detector unit. Use of this 'negative' type of transmission may not be made where the security feature of the present invention is used as will be hereinafter described.

In the known systems of this type, the codes, which are embodied in the activator units to enable identification thereof to take place, are fixed at the factory or other suitable place and cannot be easily changed. This results in two disadvantages. The first is that activator units cannot be mass produced and placed on the shelf ready for sale and the second is that such units can be stolen and then used by unauthorized persons to, for example, gain access to a restricted area, or for any other purpose than for which the activator unit was intended.

It is the object of this invention to provide activator units and a system embodying same wherein at least one but preferably both of the above mentioned disadvantages are overcome.

In accordance with this invention there is provided an activator unit adapted for use in an identification system of the above described type, the activator unit embodying a memory for the storage of a code therein and means for introducing a selected code into the memory by way of a programming unit external to the activator unit.

Further features of the invention provide for the memory to be either of a dynamic type or a static type; for the means for introducing the selected code into the memory to be a pair of power supply connections to the activator unit; and for the activator unit to be adapted to emit a coded radio frequency signal when operative.

A still further, and most important, feature of the invention provides for the activator unit to embody means for ensuring that a code contained in the memory is lost or at least becomes garbled immediately, or a predetermined length of time after the activator unit becomes de-energized such as when it is disconnected from its power supply which, in its application to vehicles, is generally the vehicle battery.

The latter feature of the invention is a security feature to prevent theft and subsequent unauthorized use of an activator unit. When applied to motor vehicles the activator units may be simply attached to a vehicle and will, in general, be powered by the vehicle battery. In such an instance, in order to facilitate servicing or changing of the battery, the activator units may be made to cause the code to be lost after a suitable time period, for example, on the order of one or more hours. Where the 'negative' type of transmission of the coded identification number is used as outlined above, it may be that no power supply to the activator unit is required and in such cases a special battery or connection to the vehicle battery may be necessary in order to embody this security feature in the activator units.

The invention also provides a programmer unit having tone generators therein and adapted for connection to the above defined activator unit in order to transfer a required code through the medium of tone bursts to the memory thereof and thumbwheel or similar switches whereby a desired decimal code may be selected.

The memory, where it is of the static type could be a ferrite or like core storage unit or a magnetic tape, card or the like. Where the memory is of a dynamic type it could be, for example, an erasable programmable read only memory (EPROM), a programmable read only memory (PROM) or, and preferably, a shift register.

In the preferred use where the memory is in the form of a shift register the code may be stored in the shift register in binary coded decimal form, and the coding thereof may be effected by way of three frequency sensitive circuits one of which positions a start/end of sequence coded markers, a second of which synchronizes a master clock in the activator unit and the third of which transmits the binary coded decimal code to the shift register. A similar arrangement could be used with other types of memories with the required variations being made.

It will be understood that the activator will be provided with a suitable tank circuit and aerial which will co-operate with a detector unit generally having one or more aerials constituted by loops of cable either buried beneath a roadway or adhered to the surface thereof. The detector unit may be provided with a suitable decoding system and the information received from an activator unit may be fed to a computer or otherwise utilized to effect any required function.

Such function may be to operate a barrier gate, traffic control lights, any security barrier, rail wagon identification etc., or for relaying information to a control data point for processing for any purpose such as controlling traffic flow or levying taxes to road users.

The invention provides many other features in addition to those defined above and such additional features will be described in relation to the specific embodiment which follows. In this description reference will be made to the accompanying drawings in which.

Figure 1:
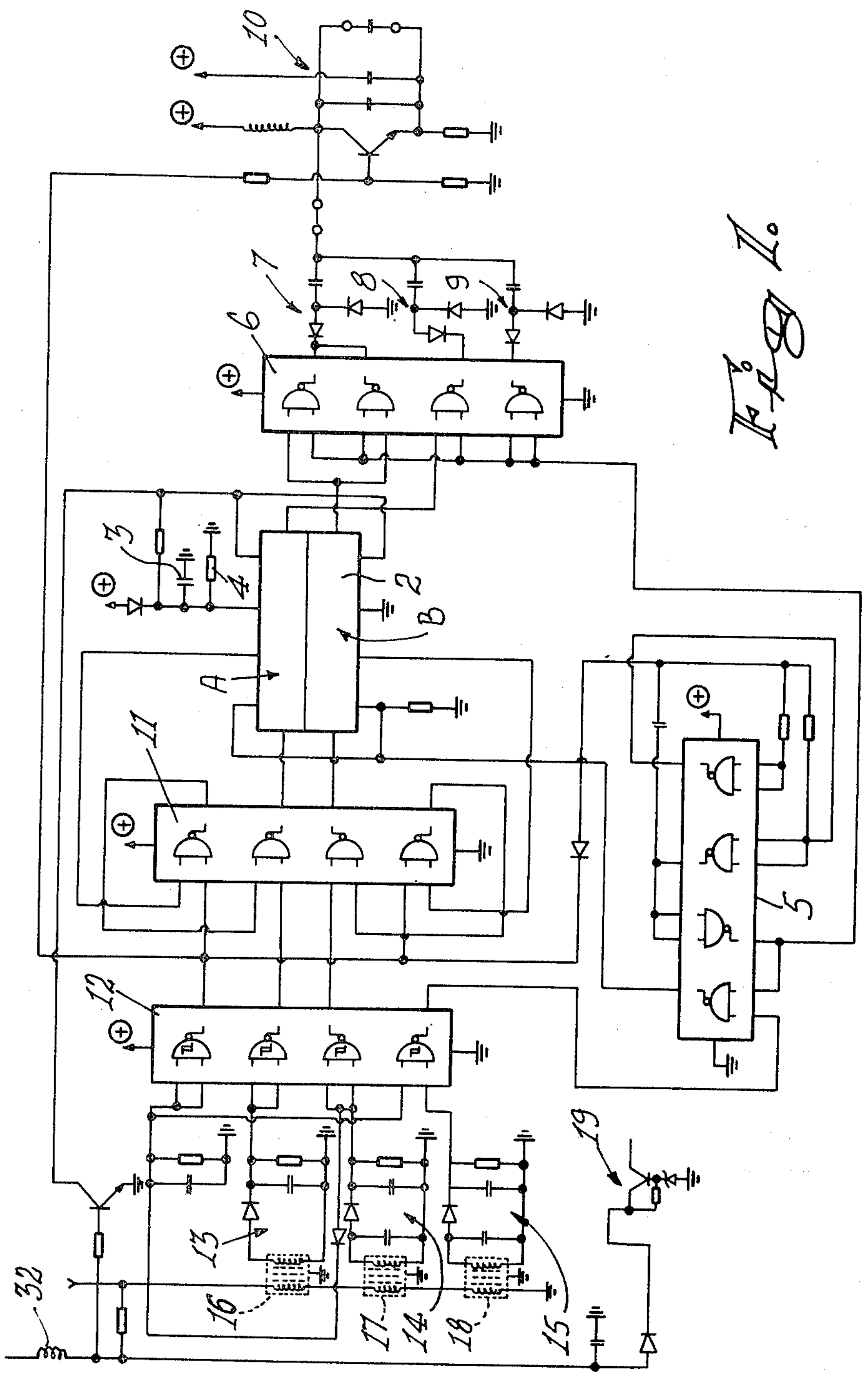
FIG. 1 is a circuit diagram of a codeable activator.
Figure 5:
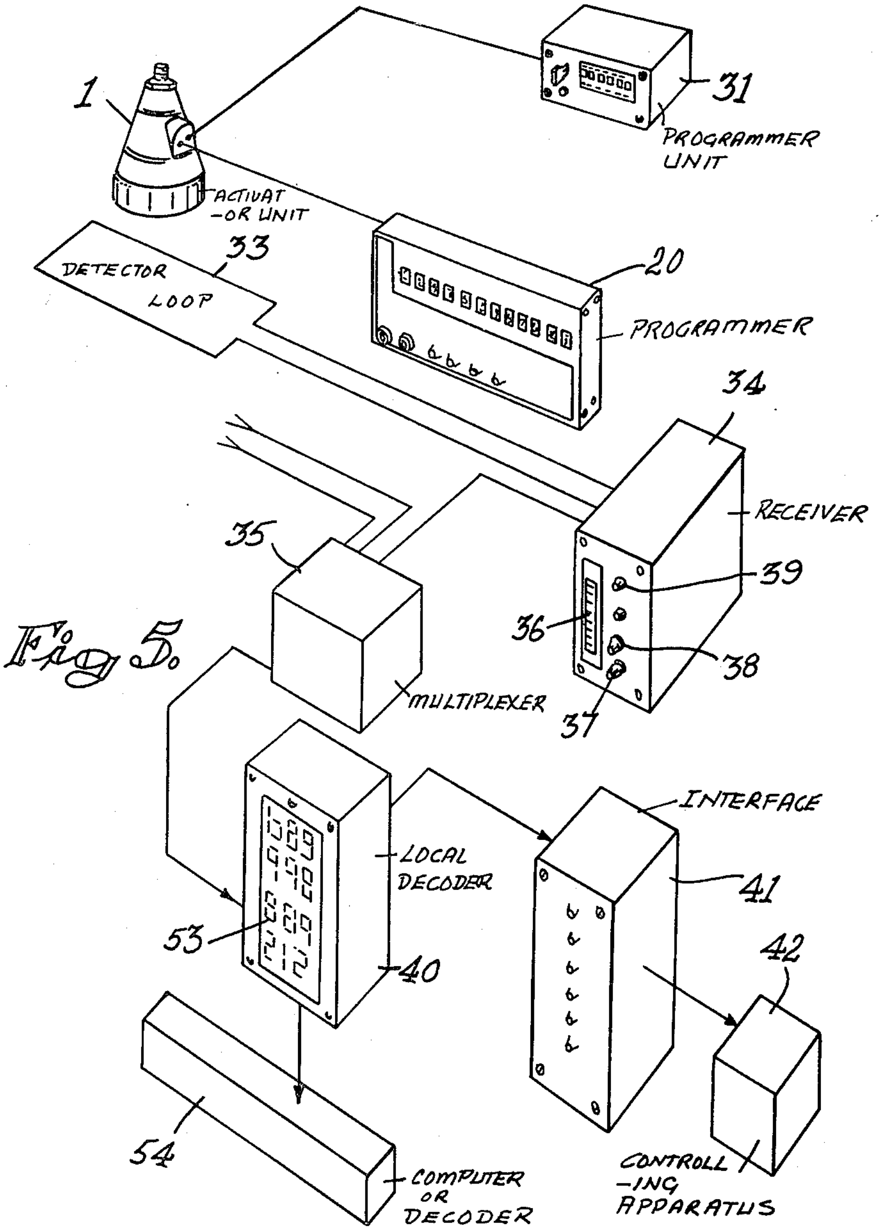
FIG. 5 illustrates in schematic manner a system and the parts thereof.

Referring now to FIG. 1 the activator unit 1 (see FIG. 5) in this embodiment of the invention has a shift register in the form of an integrated circuit (I.C.) indicated by numeral 2. The shift register I.C. has a suitable number of bi-stable bits dependant on the number of individual activator units or classes thereof to be identified and also upon the number of permutations required. In this example an I.C. having dual sixty-four bits is used but only forty-eight are rendered operative. Forty-seven of these are utilized for the purpose of coding while the other one is used as an end of sequence marker. Since four bits are required per decimal digit, eleven decimal digits of from 0 to 9 are provided and the final one, having only three bits available can be used for the decimal digits 0 to 7 inclusive. In this manner 799,999,999,999 binary coded decimal codes are capable of being stored individually in the shift register. As a result of this, great security can be achieved where required.

The shift register I.C. is of a type which only retains a code while the power supply voltage thereto is above a certain minimum. Thus this I.C. is connected to the power supply and a capacitor 3 and resistor 4 are connected in parallel with each other from this power supply to ground. Thus, if the power supply is interrupted, the I.C. can hold its code only for so long as the capacitor is charged above said minimum voltage. This time period can be adjusted to requirements by suitable choice of the capacitor and resistor. Often a time period of hours is required but several days or only a few minutes can also be achieved where required. Of course, if instant loss of the memory is required the capacitor and resistor are simply omitted.

The shift register which comprises two halves viz. A and B is adapted to rotate the binary information in the one half and the sequence marker information in the other half according to clock pulses received from a clock generator I.C. indicated by numeral 5. The clock generator I.C. is also connected to a gate I.C. indicated by numeral 6 comprising four Nand gates suitably connected to the shift register I C. The Nand gates are connected to three frequency modulating circuits 7, 8, 9 which modulate the frequencies passed to a transmitter circuit with the latter taking the form of a Colpitts oscillator circuit 10. The modulated frequencies are such that each bit of the shift register has one of two frequencies associated therewith according to the status of the forty-seven data bits and the other frequency corresponds to the end of the sequence marker. A clock pulse is provided between each data/marker bit.

The code or status of the bits in the shift register is set through a series of Nand gates in an I.C. indicated by numeral 11 which, in turn, are connected to the clock generator and to a series of Schmitt triggered gates in an I.C. indicated by numeral 12. The latter are activated by three tuned frequency responsive circuits 13, 14, 15 which sense certain tuned frequencies having the functions of updating the data on the data storing bits in the one half of the I.C. 2 and installing the start/end of sequence marker and positioning the clock in the other half respectively. The clock thereafter, in combination with the shift registers A and B, I.C. 2 and gate I.C. 6 sequentially modulate the Colpitts oscillator. Both shift registers are stepped in sympathy with each other ensuring that the marker bit which is stored in the B part of the shift register, appears at the correct instant at the relevant Q output when referenced to the A part of the shift register.

The tuned circuits are connected directly to the power input to the activator unit thereby enabling the required frequency signal to be superimposed on to the power supply. Suitable transformers 16, 17, 18 are installed to extract the frequencies to which only the appropriate tuned circuit reacts. As an example the data updating circuit is made to react to a frequency of 460 KHz, the start/end of sequence marker to a frequency of 240 KHz and the clock updating to a frequency of 125 KHz. The whole circuit has its voltage regulated by a suitable regulator 19.

Figure 2:
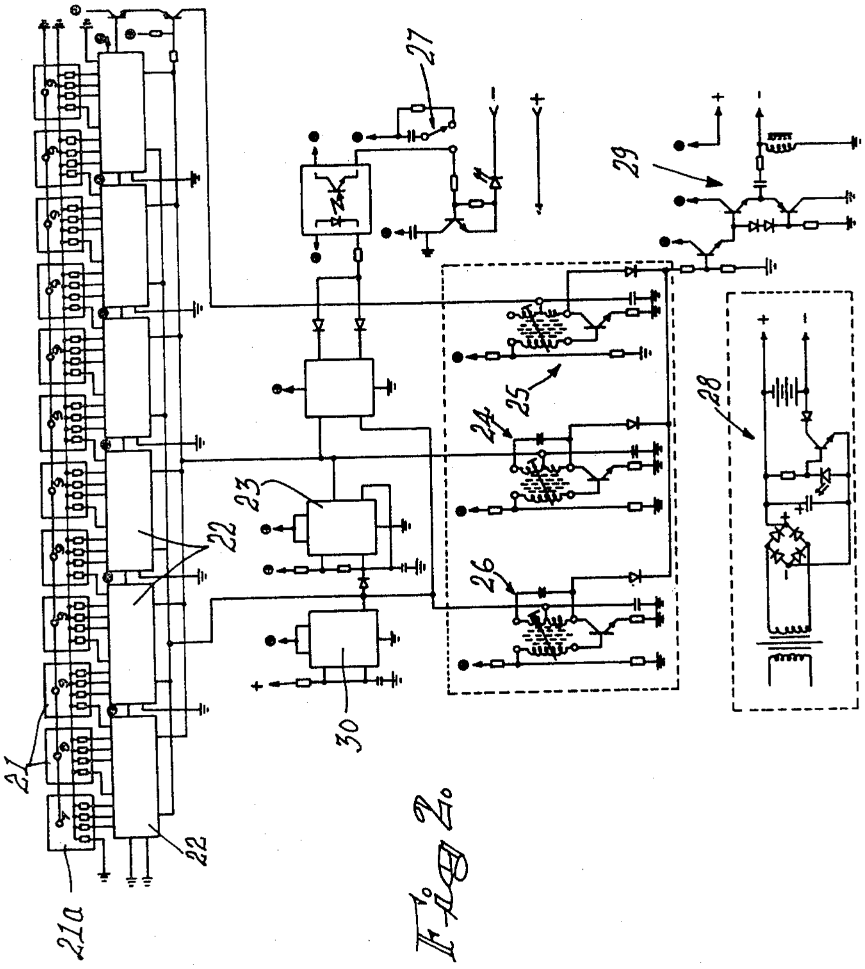
FIG. 2 is a circuit diagram of a programmer unit for the activator unit of FIG. 1.

A complementary programmer unit 20 has its circuit illustrated in FIG. 2. The unit has a series of twelve thumbwheel switches 21 whereby a twelve digit code may be selected in decimal numbers. As mentioned above, the one 21*a* is only operative from 0 through 7. Each of these thumbwheel switches provides four outputs corresponding to the 8,4,2,1 BCD code and to the correct combination is provided by the switch according to the selected number. These outputs are connected to one of six I.C.'s which define parallel to serial shift registers 22 connected in series.

A clock pulse generator 23 regulates the movement of data in these shift registers and also activates a tone generator 24 the output from which is a 125 KHz signal corresponding to the tuned circuit in the activator unit for the clock positioning function. The serial data from the shift registers is simultaneously fed to a second tone generator 25 the output from which is a 460 KHz signal corresponding to the tuned circuit for the data updating function of the activator unit.

A start function tone generator 26 is also included to activate the start updating circuit in the activator unit at 240 KHz. The programmer is actuated by a push button switch 27 and automatically shuts down once the entire code has been presented in serial form by the shift registers. The programmer unit has its own integral power supply 28 and a buffer circuit 29 at the output to the activator unit. A clock generator circuit 30 transfers the parallel BCD binary coded decimal data from the thumbwheel switches into the parallel inputs of the shift registers.

In order to install a code, or change the existing code, in an activator unit the programmer unit is set to the required code and connected to the power supply input to the activator unit. Operation of the push button switch causes the code to be transferred to the acitvator unit in a manner which will be clear from the above description.

It should be mentioned that programmer units may be provided with fewer thumbwheel settings even though the same number of permutations is required. This would be the case if some of the digits were to identify a certain class of vehicle, for example, such as omnibuses, police vehicles or the like. Also, in the activator unit itself certain digits may be programmable by a driver in the vehicle such as the number of passengers, route number or the like. In such a case a programmer unit having thumbwheel switches only for that purpose may be provided in the cab of the vehicle while the other digits are fixed. Such a programmer unit is indicated by numeral 31 in FIG. 5, in which case six digits are fixed and six are capable of being set by the person effecting the programming.

It is to be noted that in order to connect the activator unit described above to its power supply once a code has been installed in the shift register (and assuming that the time when the code drops out has not elapsed) it is essential that a choke (indicated at 32 in FIG. 1) be connected in series with the power supply. Failing this the sudden rise of the input power would, through the input gating circuit and I.C's 11 and 12 insert in the shift register marker store B of I.C. 2 an extra marker pulse. This would result in an invalid code being created. Such a choke can be hidden, for example, in a motor vehicle, and would thus serve an additional security function against unauthorized removal and reconnection to a power supply within the time allowed by the capacitor 3 and resistor 4. The choke cannot be present when the unit is programmed because of the quenching action it would have on the coding signals.

Figure 3:
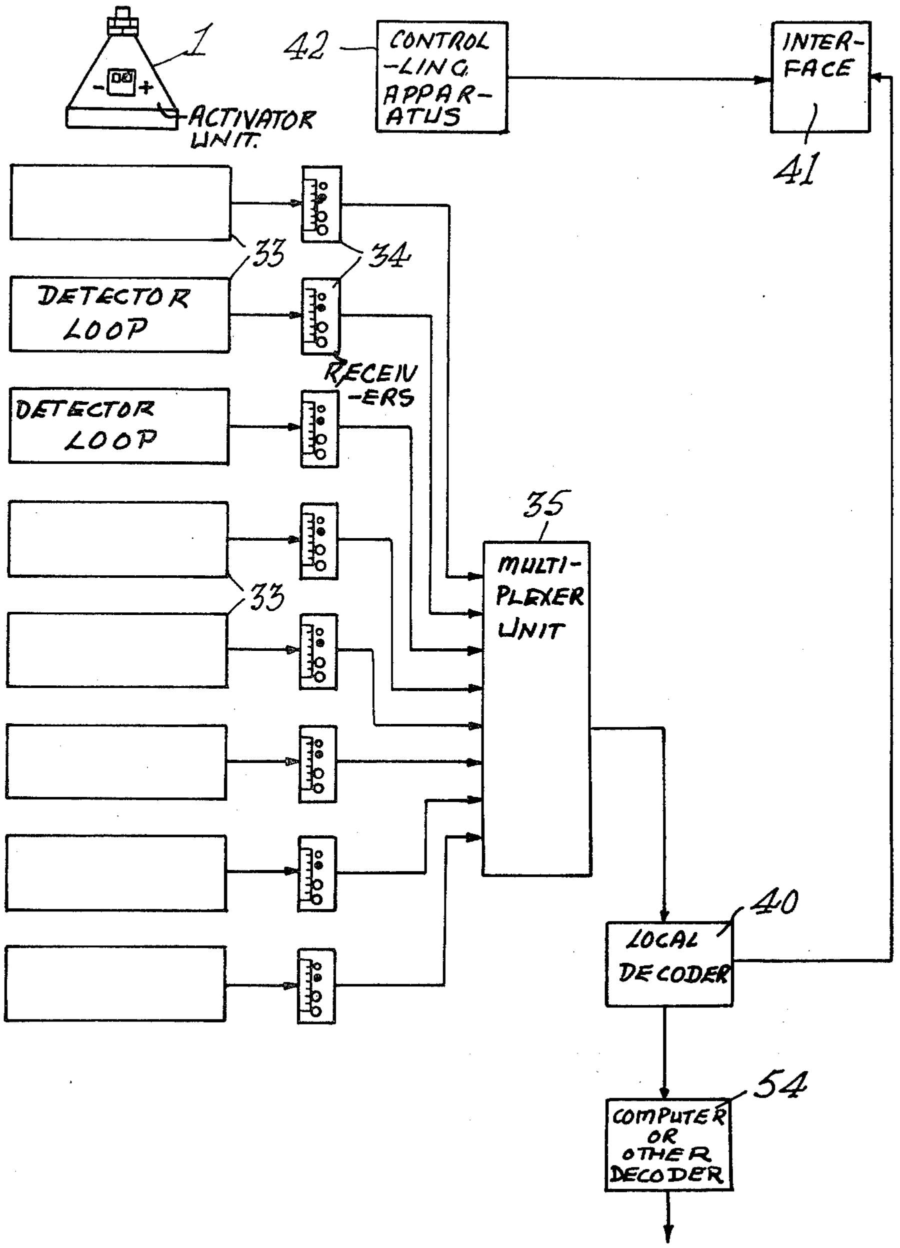
FIG. 3 is a simplified block diagram of the receiver arrangement.
Figure 4:
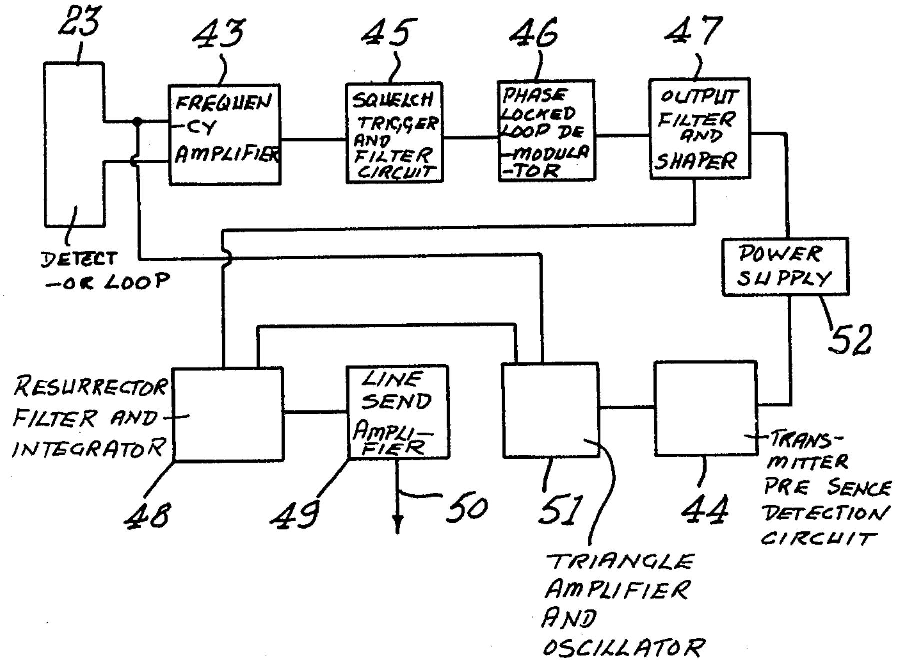
FIG. 4 is a block diagram of a receiver amplifier arrangement.

A system embodying the activator units described above will now be described in at least basic outline. A receiver arrangement for co-operating with activator units as above described is illustrated in block form in FIG. 3 while each receiver itself is illustrated in block form in FIG. 4.

In this case up to eight detector loops 33 and receivers or interrogators 34 are connected to a multiplexer unit 35.

Each interrogator is fed the signal that is received by the loop and converts this to a discreet pulse form while at the same time monitoring the loop and communicating its condition to the decoder (see hereunder). Should the loop break or become disconnected the interrogator immediately sends out an alarm signal.

A panel meter 36 is provided to indicate the relative received signal strength. This meter read in relation to the setting of a gain control 37 gives a useful indication of loop sensitivity and activator unit radiated power.

The interrogator is also equipped with a delay control 38 (10–110 mS) which can be adjusted so that fast travelling activator units are ignored. This feature is of considerable value in some priority applications where it is not necessary to give prior to a vehicle that is already moving quickly.

A primary validity check (by means of a bit count) is performed within the interrogator and a relay output and L.E.D. indication 39 is given if any activator unit occupies the loop zone. This output is useful for counting and other simple functions.

Multiple loops can, however, be connected to one receiver unit 34 where the incidence of two simultaneous transmitter equipped vehicles traversing both loops, is negligible. Also, if a simple system with only one loop is used no multiplexer unit is necessary at all. The single output from the multiplexer unit 35 (which also records the loop number) may be amplified by an amplifier for line transmission to a remote location. In addition, or alternatively, the output may be fed to a local decoder 40 and thereafter via a suitable interface 41 to a controlling apparatus 42 such as a traffic signal controller for example. In this way the required objective may be attained.

The receiver itself is simply of a design providing the required output and includes a radio frequency amplifier 43 connected to the associated detector loop 33. The latter is also connected to a transmitter presence detection circuit 44 having a mimic and relay. The output from the radio frequency amplifier is fed through a squelch trigger and filter circuit 45 to a phase locked loop demodulator 46 and thence to a demodulated output filter and shaper 47. The output from the latter is fed to a four level resurrection filter and integrator 48 and thence to a balanced load compensating line send amplifier 49 which provides the final output 50. The four level resurrection filter and integrator 48 is also fed by a triangle oscillator and amplifier 51 to provide a staircase signal output in the absence of a transmitter. The whole amplifier is powered by a regulated current limited power supply 52.

The decoder 40 is fed by the receiver or interrogator and decodes the signal into decimal form. It may be provided with a digital display as indicated by numeral 53 in FIG. 5 and its outputs may be fed to a computer 54 or other recorder. The output from the decoder may also be fed to an interface 41 as mentioned above which is sensitive to certain codes but not to others. Such an interface would provide a simple switching function at its output to effect the desired switching of a traffic light, for example, or to open a road barrier.

It will be understood that the apparatus described above has many different applications as will be apparent from the aforegoing. The actual circuits used may be varied in any suitable manner as will be apparent to those skilled in the art.

What I claim as new and desire to secure by Letters Patent is:

1. A coded identification system comprising:

an activator unit comprising a programmable memory for storing one of a plurality of activator identification codes, means for decoding an externally applied information signal frequency coded with one of said plurality of identification codes and for storing a frequency decoded identification code in said programmable memory and means for modulating an electromagnetic radiation field established between said activator unit and a detector unit with a stored identification code;

means for establishing said electromagnetic radiation field between said activator and said detector;

a programming unit located externally of said activator unit comprising means for selecting one of a plurality of identification codes, means for frequency coding an information signal according to a selected identification code, and means for applying said frequency coded information signal to said activator unit;

a detector unit comprising means for sensing said modulated electromagnetic radiation field, and means for determining the identification code modulated on said electromagnetic radiation field.

2. A system as claimed in claim 1 wherein said means for establishing an electromagnetic radiation field is part of said detector unit and said means for modulating converts a stored identification code into a form which inflicts a load pattern onto said electromagnetic radiation field emitted by said detector unit, the load pattern causing modulation of said electromagnetic radiation field which is characteristic of said stored code.

3. A system as claimed in claim 1 in which said programmable memory includes two shift register portions for storing respectively an identification code and a sequence marker, and, a clock signal means for shifting data in said two shift register portions in unison.

4. A system as claimed in claim 3 wherein said means for establishing an electromagnetic field is part of said activator unit and includes a radio frequency transmitter, said means for sensing including an aerial responsive to said transmitted radio frequency, said means for detecting including a demodulator for demodulating said electromagnetic radiation signal.

5. A system as claimed in claim 1 wherein said means for decoding includes at least two tuned frequency responsive circuits for frequency decoding said frequency coded information signal and for applying a decoded identification code to storage locations in said programmable memory and wherein input terminals accessible from the exterior of the activator unit are connected to said tuned frequency responsive circuits.

6. A system as claimed in claim 5 wherein said input terminals are a part of the power supply terminals for supplying power to said activator unit and the tuned frequency responsive circuits are adapted to react to electrical frequencies superimposed on said power supply terminals.

7. A system as claimed in claim 5 wherein said programmable memory is a shift register and said means for decoding includes three tuned frequency responsive circuits, one operatively connected to install a start/end of sequence marker in one portion of said shift register, one for installing data in the data storage bits of another portion of said shift register, and one for positioning a clock signal relative to the data and start/end of sequence marker.

8. A system as claimed in claim 1 in which said programmable memory is of the dynamic type which requires the periodic application of a refresh signal to retain stored data.

9. A system as claimed in claim 1 in which said programmable memory is of the static type which does not require the periodic application of a refresh signal to retain stored data.

10. A system as claimed in claim 1 further comprising means responsive to disconnection of said activator unit from an external power supply normally connected thereto for destroying an identification code stored in said programmable memory upon disconnection of said activator unit from said external power supply.

11. A system as claimed in claim 10 in which the said programmable memory is of the dynamic type which requires the periodic application of a refresh signal to retain stored data and said means for destroying comprises a capacitor and a bleed resistor connected to cause loss of the identification code in said programmable memory a predetermined time after disconnection of said activator unit from said power supply.

12. A system as claimed in claim 5 wherein said means for frequency coding converts a selected identification code into frequency signals complementary to the tuned frequency responsive circuits in said activator unit.

13. A system as claimed in claim 1 wherein one of said activator unit and detector unit is provided on a movable object and the other is stationary.

14. A coded information system comprising:

an activator unit comprising memory means having two shift register portions for respectively storing an identification code and a sequence marker, clock means for shifting data in said two shift register portions in unison, means for transmitting an electromagnetic radiation signal, means for reading an identification code stored in said memory and for modulating said transmitted electromagnetic radiation signal in accordance with said identification code, means for loading an identification code and sequence marker into said memory, said means for loading including terminals accessible from the exterior of said activator unit, three tuned frequency responsive circuits connected to said terminals and means responsive to code signals at said terminals detected by said three tuned circuits for translating said detected signals into identification code signals, a sequence marker, and a clock positioning signal for said clock means and for loading under control of said clock means said translated identification code signals and sequence marker respectively into the two shift register portions; and, a detector unit responsive to said electromagnetic signal for determining the identification code stored in said memory.

15. A coded information system comprising an activator for sending data and a detector responsive to receive said data, said activator further comprising:

memory means having two shift register portions for respectively storing an identification code and a sequence marker, clock means for shifting data in said two shift register portions in unison, means for transmitting a signal, means for reading an identification code stored in said memory and for modulating said transmitted signal in accordance with said identification code, means for loading an identification code and sequence marker into said memory, said means for loading including terminals accessible from the exterior of said activator unit, three tuned frequency responsive circuits connected to said terminals and means responsive to code signals at said terminals detected by said three tuned circuits for translating said detected signals into identification code signals, a sequence marker, and a clock positioning signal for said clock means and for loading under control of said clock means said translated identification code signal and sequence marker respectively into the two shift register portions.

16. A system as claimed in claim 8 in which said memory is a shift register.

17. A coded identification system comprising an activator unit comprising a memory for storing an identification code, a means for reading out said stored code and for modulating an electromagnetic signal with said stored code, and a means responsive to a coded signal generated externally of said activator unit for introducing identification codes into said memory including at least two tuned frequency responsive circuits connected to input terminals accessible from the exterior of said activator unit and a logic circuit connected to said two tuned frequency responsive circuits and adapted to provide an output to said memory in accordance with signals applied to said input terminals, said coded signal being a frequency coded signal;

a detector unit responsive to said modulated electromagnetic signal for determining said identification code stored in said memory; and programming means external of said activator unit for formulating said coded signal and applying said coded signal to said means for introducing identification codes into said memory.

18. A system as claimed in claim 17 in which said memory is a shift register having two shifting portions and said means for introducing includes three tuned frequency responsive circuits connected to said logic circuit; one tuned frequency responsive circuit operatively connected to cause said logic circuit to generate and store a start/end of sequence marker in the data storage bits of one shifting portion of said memory; one tuned circuit operatively connected to cause said logic circuit to generate and store an identification code in the data storage bits of a second shifting portion of the shift register and one tuned circuit operatively connected to cause said logic circuit to position a clock signal relative to the identification code and start/end of sequence marker.

19. A system as claimed in claim 17 in which switches are provided in said programming means for selecting a required identification code.

20. A system as claimed in claim 19 wherein said switches are thumbwheel switches.

21. A system as claimed in claim 1 further comprising at least one loop detector provided in association with said detector unit for detecting said electromagnetic signal encoded with said identification code stored in said memory.

22. A system as claimed in claim 17 in which said input terminals are power supply input terminals for a d.c. power supply and said tuned frequency responsive circuits are adapted to react to electrical frequencies superimposed on a d.c. power supply connected to said terminals.

* * * * *